Figure 1:
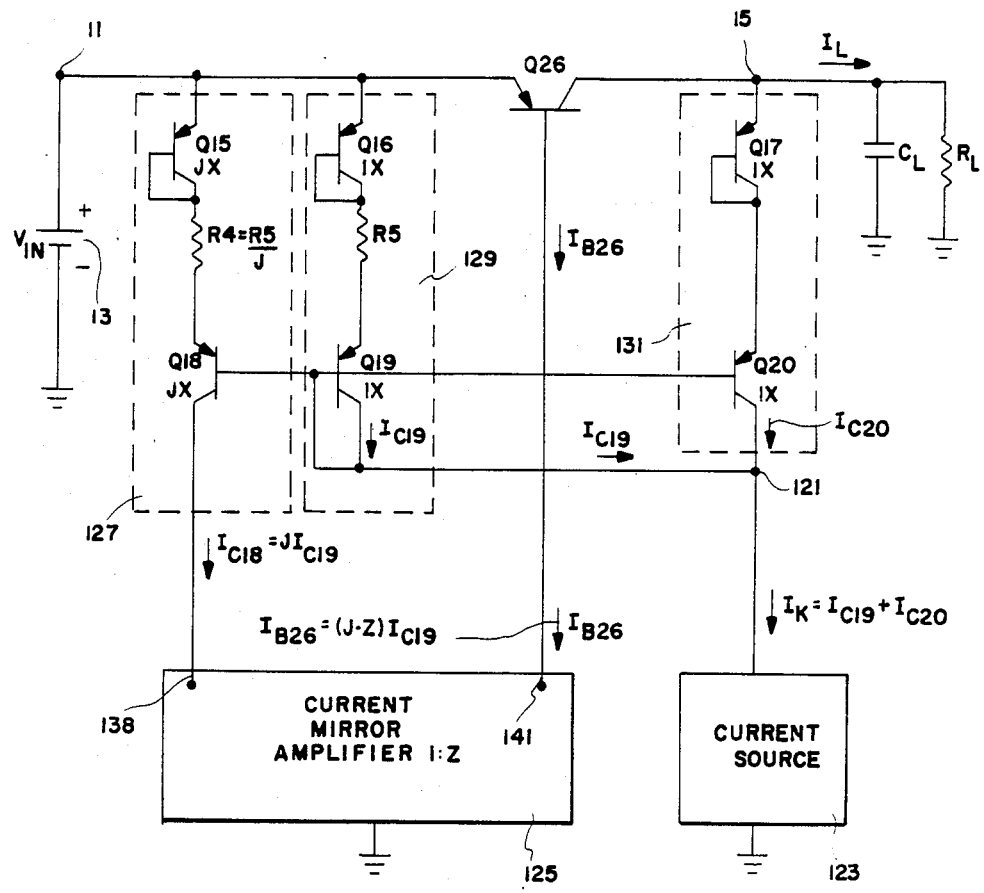

United States Patent [19]

Giordano

[11] Patent Number: 4,684,878
[45] Date of Patent: Aug. 4, 1987

[54] TRANSISTOR BASE CURRENT REGULATOR

[75] Inventor: Raymond L. Giordano, Flemington, N.J.

[73] Assignee: RCA Corporation, Somerville, N.J.

[21] Appl. No.: 860,814

[22] Filed: May 8, 1986

[51] Int. Cl.⁴ .............................................. G05F 1/56
[52] U.S. Cl. .................................... 323/279; 323/280
[58] Field of Search ............................... 323/275–277, 323/279, 289, 280–281, 299, 303, 315–316

[56] References Cited

U.S. PATENT DOCUMENTS

| 3,100,863 | 8/1963 | McCullough | 323/279 |
| 3,405,319 | 10/1968 | Barringer | 323/279 X |
| 3,579,089 | 5/1971 | Giess et al. | 323/279 |

FOREIGN PATENT DOCUMENTS 1579326  11/1980  United Kingdom ................ 323/279

Primary Examiner—Peter S. Wong
Attorney, Agent, or Firm—Henry I. Schanzer; Birgit E. Morris; Stanley C. Corwin

[57] ABSTRACT

The collector-to-emitter voltage ($V_{CE}$) of a transistor switch and its base drive are designed to have maximum specified values when the transistor switch conducts the highest specified load current. The base drive to the transistor switch is reduced when the load current is reduced, or when the beta of the transistor increases or is greater than a minimum specified value. The base drive to the transistor switch is regulated by sensing the $V_{CE}$ of the transistor switch and producing a control current which decreases with decreasing $V_{CE}$ and increases with increasing $V_{CE}$. The control current is then used to supply a regulated base current to the transistor switch while maintaining the $V_{CE}$ of the transistor below, the maximum specified value, for values of load current below the maximum specified level.

10 Claims, 2 Drawing Figures

TRANSISTOR BASE CURRENT REGULATOR

This invention relates to circuitry for controlling, or regulating, the base current of a transistor.

In many applications, it is desirable and/or necessary to use a bipolar transistor as a switch to couple an operating (or input) voltage ($V_{IN}$) to a load. In some of these applications, such as in automotive systems, the load may vary over a wide range of values (e.g. from 16 ohms to 2000 ohms).

Typically, for proper operation, the circuitry associated with the transistor switch is designed to provide sufficient base drive to the transistor switch to cause it to saturate for the highest loading condition (i.e. when the load has its lowest ohmic value and draws the largest current). Assume, for purpose of illustration, that the maximum operating voltage ($V_{IN}$) is 16 volts and the heaviest load is 16 ohms whereby the transistor switch must then pass a load current ($I_L$) between its emitter and collector of approximately one (1) ampere. Assume further that the minimum forward current gain (Beta) of the transistor switch is 20 whereby a base current of approximately 50 milliamperes must be provided to the transistor switch to ensure that it is driven into saturation. This base drive is supplied even when the loading is decreased. Thus, when a 2000 ohm load is connected in circuit with the similarly biased transistor switch, the load current is approximately 8.0 milliampere and the base drive remains at the 50 milliampere level, although a base drive of 0.4 milliampere would be sufficient to saturate the transistor switch. It is evident that supplying a base drive of 50 milliampere to a transistor having a Beta of 20 in order to pass a load (or collector-to-emitter) current of 8.0 milliamperes is highly inefficient. Much power is wastefully dissipated in the base drive circuitry. Also, the transistor switch is overdriven into saturation whereby its turn-off is very slow.

The inefficiency of the system is even greater when the input voltage also may vary over a wide range (e.g. from more than 16 volts to 4 volts) while the base drive is designed to meet the worse case conditions of load (e.g. 16 ohms), voltage (e.g. 16 volts) and minimum Beta. For example, for a $V_{IN}$ of 4 volts with a 2000 ohm load the transistor switch has to pass a load current of approximately 2 milliamperes. Supplying the transistor switch with a base drive of 50 milliampere is clearly inefficient when a base drive of 0.1 milliamperes would be sufficient. Therefore a problem of base overdrive and excessive power dissipation exists where the base drive of a transistor switch is designed to cause that transistor to pass a high load current and the transistor is actually operated under lower load current conditions.

The problem of overdriving the base of a transistor switch is overcome in circuits embodying the invention by sensing the collector-to-emitter voltage ($V_{CE}$) of the transistor switch and controlling its base drive as a function thereof. The $V_{CE}$ of the transistor switch and its base drive are designed to have their maximum value when the transistor switch conducts the highest rated load current. When the $V_{CE}$ of the transistor switch decreases below its maximum value, the decrease in $V_{CE}$ is sensed and the base drive to the transistor switch is decreased.

Figure 2:
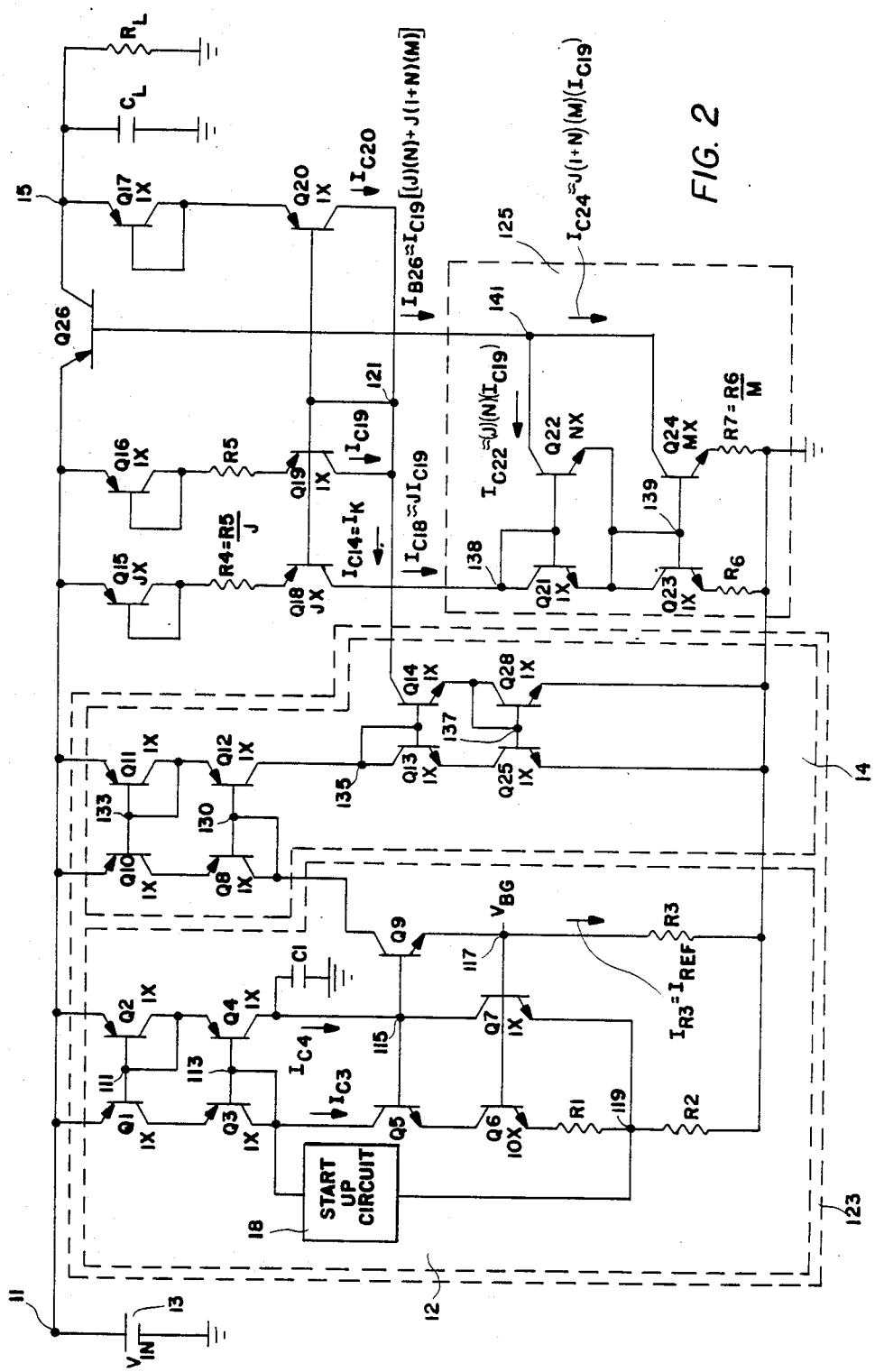

In the accompanying drawing, like reference characters denote like components; and FIG. 1 is a partial schematic, partial block, diagram of a circuit embodying the invention; and FIG. 2 is a detailed schematic diagram of a circuit embodying the invention.

In FIGS. 1 and 2, the transistors used to illustrate the invention are bipolar transistors and the relative physical sizes of certain transistors, where pertinent, is given by a number or a capital letter preceding the letter "x" (e.g. 1x, 2x, Jx). The physical size of a device is proportional to the number or letter preceding the letter "x"; i.e. a 2x (or Jx) device has twice (or Jx) the emitter area of a 1x device and a 2x (or Jx) device conducts twice (or Jx) the current of a 1x device, for like bias conditions. Also, in the discussion to follow, the base-to-emitter voltage ($V_{BE}$), the collector-to-emitter voltage ($V_{CE}$), or the collector current ($I_C$) of a particular transistor Qi is at times denoted as $V_{BEi}$, $V_{CEi}$, or $I_{Ci}$. Also, in the discussion to follow, the voltage drop between the collector and emitter of a transistor is sometimes expressed as $V_{EC}$ (rather than $V_{CE}$) to indicate that the emitter voltage is more positive than the collector voltage. Likewise, the voltage drop between the base and emitter of a transistor is sometimes expressed as $V_{EB}$ (rather than $V_{BE}$) to indicate that the emitter voltage is more positive than the base voltage.

The circuit of FIG. 1 includes a power source 13, which may be, for example, a car battery, connected to an input terminal 11. The voltage produced by source 13 functions as the input voltage to the system and is denoted herein as $V_{IN}$. $V_{IN}$ may be specified as being nominally equal to 12 volts; but it may range, for example, from 4 volts to more than 16 volts. $V_{IN}$ is coupled to a load, $R_L$, by means of a normally turned-on PNP bipolar transistor switch, Q26, whose emitter is connected to terminal 11 and whose collector is connected to an output terminal 15.

The load connected between terminal 15 and ground is represented by a resistor $R_L$ across which is connected a filtering and energy storage capacitor $C_L$. Although the load is represented as a resistor $R_L$ and a capacitor $C_L$, it may be, in practice, any one of a number of elements. The circuit of FIG. 1 is intended to drive a load whose equivalent impedance may have a broad range of values, for example, from 16 ohms to 2000 ohms.

Transistor Q26 conducts a load current ($I_L$) from its emitter-to-its-collector which is a function of its base current, $I_{B26}$, and its forward current gain ($\beta_{26}$) [i.e. $I_L = (\beta_{26})(I_{B26})$]. In the circuit of FIG. 1, the base current, $I_{B26}$, is regulated to prevent an excessive base overdrive condition. Although $I_{B26}$ is regulated, $I_{B26}$ is always of sufficient amplitude to enable Q26 to be switched-on, and to cause the collector-to-emitter voltage ($V_{EC26}$) of Q26 to be less than a maximum specified value, for all values of load current equal to or less than the maximum specified load current.

The base current $I_{B26}$ is an amplified version (i.e., JZ) of the control current $I_{C19}$ flowing in the collector of transistor Q19 of network 129.

In the circuit of FIG. 1, two networks (129 and 131) are used to effectively sense the potential $V_{EC26}$ across the collector-to-emitter of Q26 producing currents $I_{C19}$ and $I_{C20}$ which vary relative to each other as a function of $V_{EC26}$.

Network 129 includes a diode-connected transistor Q16, a resistor $R_5$, and a transistor Q19. The emitter of Q16 is connected to terminal 11 and the base and collector of Q16 are connected in common to one end of resistor $R_5$. The other end of $R_5$ is connected to the emitter of Q19 whose collector and base are connected in common to node 121. Network 131 includes a diode-connected transistor Q17 and a transistor Q20. The emitter of Q17 is connected to terminal 15 while its collector and base are connected to the emitter of Q20. The base and collector of Q20 are connected in common to node 121. Ignoring base currents, Q19 produces a current, $I_{C19}$, which flows into node 121 and Q20 produces a current, $I_{C20}$, which also flows into node 121.

A current source 123 connected between node 121 and ground, conducts a relatively constant current, $I_K$. As detailed below, $I_K$ may vary with temperature, or voltage. But at any given temperature or voltage, its value is relatively constant. Currents $I_{C19}$ and $I_{C20}$ are summed at node 121 and flow via current source 123 to ground. The sum of $I_{C19}$ and $I_{C20}$ is then equal to the relatively constant current, $I_K$, which may be expressed, mathematically, as follows:

$$I_{C19} + I_{C20} = I_K \qquad \text{eq. 1}$$

Since the sum of $I_{C19}$ and $I_{C20}$ is equal to a relatively constant current, $I_K$, an increase in $I_{C19}$ causes a corresponding decrease in $I_{C20}$, and a decrease in $I_{C19}$ causes a corresponding increase in $I_{C20}$. The current $I_K$ will always divide between networks 129 and 131. That is, a portion (e.g. 0% to 100%) of $I_K$ will flow in network 129 and the remainder (e.g. 100% to 0%) of $I_K$ will flow in network 131. Furthermore, as detailed below, $I_{C19}$ and $I_{C20}$ vary as a function of the collector to emitter voltage of Q26. It will now be shown that $I_{C19}$ increases ($I_{C20}$ decreases) with increasing $V_{EC26}$ and $I_{C19}$ decreases ($I_{C20}$ increases) with decreasing $V_{EC26}$.

An examination of FIG. 1 indicates that network 129 is connected between terminal 11 and node 121. The emitter-to-collector of Q26 and network 131 are also connected between terminal 11 and node 121. Hence, the voltage drop ($V_{EC26}$) across the emitter to collector of Q26 plus the voltage drop across network 131 must equal the voltage drop across network 129.

This relationship may be expressed mathematically as follows:

$$V_{EB16} + V_{EB19} + I_{C19}R_5 = V_{EC26} + V_{EB17} + V_{EB20} \qquad \text{eq. 2}$$

Equation 2 may be rewritten as follows:

$$V_{EC26} - I_{C19}R_5 = V_{EB16} + V_{EB19} - V_{EB17} - V_{EB20} \qquad \text{eq. 3}$$

For Q16 having the same geometry as Q17 and for Q19 having the same geometry as Q20, equation 3 may be simplified as follows:

$$V_{EC26} - I_{C19}R_5 = 2(V_{EB19} - V_{EB20}) \qquad \text{eq. 4}$$

The difference between $V_{EB19}$ and $V_{EB20}$ in equation 4 may be expressed in terms of their collector currents whereby equation 4 may be rewritten as:

$$(V_{EC26} - I_{C19}R_5)/2 = [\eta KT/q]\ln[I_{C19}/I_{C20}] \qquad \text{eq. 5}$$

Equation 5 may be further simplified as:
$$V_{EC26} = 2[\eta KT/q]\ln[I_{C19}/I_{C20}]I_{C19}R_5 \qquad \text{eq. 6}$$

Where: $\eta KT/q$ is equal to 34.6 millivolts at 25° C.; and T is the temperature in degrees Kelvin.

Thus, $V_{EC26}$ may be expressed as a function of $I_{C19}$ and $I_{C20}$. These currents in fact are used to sense the collector-to-emitter voltage of Q26 and to then control its base drive.

As is evident from an examination of FIG. 2, (to be discussed below) the relatively constant current, $I_K$, may be expressed as follows:

$$I_K \approx V_{BG}/R_3 \qquad \text{eq. 7}$$

Where:

$V_{BG}$ is approximately equal to the bandgap voltage of silicon, and $R_3$ is a resistor whose ohmic value sets the value of the current $I_{R3}$ which is equal to $I_{REF}$ which, in the embodiment of FIG. 2, is also equal to $I_K$.

The voltage drop ($V_{R5}$) across resistor R5 in FIG. 1 may then be expressed as follows:

$$I_{C19} \cdot R_5 = V_{R5} = V_{BG}[R_5/R_3] \cdot [I_{C19}/I_K] \qquad \text{eq. 8}$$

Substituting the right hand side of equation 8 in equation 6 produces the following:

$$V_{EC26} = 2[\eta KT/q]\ln[I_{C19}/I_{C20}] + V_{BG}[R_5/R_3] \cdot [I_{C19}/I_K] \qquad \text{eq. 9}$$

Equation 9 indicates that $V_{EC26}$ is the sum of two terms. The second term—$V_{BG}[R_5/R_3][I_{C19}/I_K]$—expressing the voltage drop across $R_5$ is virtually independent of temperature. By making this term large relative to the other term, temperature variations are significantly reduced. Equation 9 may be used to calculate values of $I_{C19}$, $I_{C20}$ and $V_{R5}$ for different values of $V_{EC26}$.

Some of the calculated results for $V_{EC26}$ at 25° C. are given in Table 1 below, assuming $I_K = 100\%$ of the current comprising $I_{C19}$ and $I_{C20}$ and with $V_{BG}[R_5/R_3]$ set at 0.8 volt.

TABLE 1

| $V_{EC26}$ volts | $I_{C20}$ % $I_K$ | $I_{C19}$ % $I_K$ | $V_{R5}$ volts |
|---|---|---|---|
| 1.11 | 1 | 99 | 0.792 |
| 0.87 | 10 | 90 | 0.72 |
| 0.74 | 20 | 80 | 0.64 |
| 0.62 | 30 | 70 | 0.56 |
| 0.51 | 40 | 60 | 0.48 |
| 0.40 | 50 | 50 | 0.40 |
| 0.29 | 60 | 40 | 0.32 |
| 0.18 | 70 | 30 | 0.24 |
| 0.06 | 80 | 20 | 0.16 |

An examination of Table 1 indicates that when $V_{EC26}$ is 1.11 volt, the current $I_{C19}$ through network 129 is 99% of the current $I_K$ while $I_{C20}$ is 1%. When $V_{EC26}$ is equal to 0.4 volt, $I_{C19}$ is equal to $I_{C20}$, each being equal to 50% of $I_K$. When $V_{EC26}$ is 0.06 volts $I_{C19}$ is equal to 20% of $I_K$ and $I_{C20}$ is 80% of $I_K$.

$I_{C19}$ increases when $V_{EC26}$ increases and decreases when $V_{EC26}$ decreases. An increase in $V_{EC26}$ normally indicates that more base current should be supplied to Q26 while a decrease in $V_{EC26}$ indicates that its base current may be reduced. This is accomplished in the circuit of FIG. 1 by amplifying the current $I_{C19}$ in network 129 by means of network 127 which functions as a current mirror amplifier whose output ($JI_{C19}$) is fed to current mirror amplifier (CMA) 125 which multiplies $JI_{C19}$ by a factor of Z to produce the current $I_{B26}$ supplied to the base of Q26; where $I_{B26}$ is equal to $J \cdot Z \cdot I_{C19}$.

Network 127 includes a diode connected transistor Q15, a resistor R4 and a transistor Q18. The emitter of Q15 is connected to terminal 11, the emitter and collector of Q15 are connected to one end of resistor R4 and the other end of resistor R4 is connected to the emitter of Q18. The base of Q18 is connected to the base and collector of Q19 and the base and collector of Q20 at node 121 and the collector of Q18 is connected to the input 138 of CMA 125.

The current ($I_{C19}$) flowing through Q16, R5 and Q19 is mirrored in the collector-to-emitter paths of Q15 and Q18 and in resistor R4 producing a current $I_{C18}$. Q15 and Q18 are made "J" times the physical size of Q16 and Q19, respectively, and R4 is made equal to R5/J. Consequently, the current $I_{C18}$ is "J" times the current $I_{C19}$; where J may be any suitable number.

The current $I_{C18}$ is applied to the input 138 of CMA 125 which amplifies the current and produces the base current $I_{B26}$ equal to Z·$I_{C18}$ at its output node 141. Since $I_{C18}$ is equal to J·$I_{C19}$, it is clear that $I_{B26}$ is equal to (J·Z)$I_{C19}$. CMA 125 may be any one of a number of known current mirror amplifiers. However, a particular CMA design, discussed below, is detailed in FIG. 2.

Multiplying $I_{C19}$ by a constant (i.e. J·Z) to produce the base current $I_{B26}$ ensures that Q26 is, at all times, driven to a desired level of saturation and that the variations in $I_{C19}$ and the corresponding changes in $I_{B26}$ provide Q26 with increasing base drive for conducting increasing load current and decreasing base drive when the load current decreases.

Additional insight in the operation of the circuit is obtained by examining equation 2 and the corresponding portion of the circuit shown in FIG. 1 which reveal that for Q16 and Q17 being equal geometry devices and for Q19 and Q20 being equal geometry devices, the current $I_{C19}$ produced in network 129 is equal to the current $I_{C20}$ produced in network 131 when $V_{EC26}$ is equal to the voltage drop $V_{R5}$ across resistor R5. For ease of discussion, refer to this value of $V_{EC26}$ (when $I_{C19}=I_{C20}$) as $V_A$.

If and when $V_{EC26}$ increases and becomes greater than $V_A$, the voltage drop across network 131 decreases (assuming the voltage $V_{IN}$ at terminal 11 to be constant) while the voltage drop across network 129 remains the same (or increases). Consequently, the voltage between the base and emitter of Q20 decreases while the voltage between the base and emitter of Q19 increases. Hence, $I_{C19}$ increases and $I_{C20}$ decreases as $V_{EC26}$ becomes greater than $V_A$. In an analogous manner as $V_{EC26}$ decreases below $V_A$, the voltage drop across network 131 increases causing an increase in the $V_{EB}$ of Q20 and hence an increase in $I_{C20}$. An increase in $I_{C20}$ causes a corresponding decrease in $I_{C19}$. Thus, as $V_{EC26}$ decreases below $V_A$, $I_{C19}$ decreases while $I_{C20}$ increases. The current $I_{C19}$ multiplied by J·Z via Q18 and CMA 125 is then supplied as $I_{B26}$ to the base of Q26 causing a corresponding change in $I_L$ and $V_{EC26}$ to satisfy the relationships discussed above.

In the design of circuits embodying the invention, as in prior art circuits, the base drive circuit must be capable of supplying the minimum $I_{B26}$ needed to saturate Q26 for the condition of maximum load current. However, in contrast to prior art circuit, the circuit of the invention will cause $I_{B26}$ to decrease when the load current decreases, or when the Beta of the switching transistor increases above a specified minimum ($\beta$MIN) value.

Assume, by way of example, that the maximum allowable $V_{EC}$ between the emitter and collector of Q26 is 1.11 volt when conducting a current of 1.04 ampere, and that 1.04 ampere is the maximum rated load current.

Assume further that the maximum $V_{IN}$ is 17.91 volts and that the lowest ohmic value of $R_{L\ MIN}$ is approximately 16 ohms whereby a current of approximately 1.04 amp is to flow between the emitter and collector of Q26. Assume further that the lowest specified Beta of Q26 is 21. For the above assumptions, the base current $I_{B26}$ for Q26 must be approximately 49.5 milliamperes. Assuming that JZ is equal to 500, $I_{C19}$ would be designed to be 99 microamperes to provide the base current. Assuming the current, $I_K$, to be equal to 100 microamperes, $I_{C20}$ would then be equal to 1 microampere.

Having designed the system to handle the worst case condition (i.e. maximum $V_{IN}$ and $I_{LOAD}$ and minimum Beta) it can be shown that the circuit of FIG. 1 will regulate $I_{B26}$ such that it will always be less than 49.5 milliamps and that $V_{EC26}$ will always be less than 1.11 volt for all values of $R_L$ having greater ohmic value than 16 ohms and for all values of Beta of Q26 greater than 21.

For example, assume that $R_L$ increases from 16 ohms to 33.3 ohms, while $V_{IN}$ remains at 17.9 volts. For this condition, $I_L$ is approximately 525 milliamperes and $I_{B26}$ is 25 milliamperes. $I_{C19}$ and $I_{C20}$ can then each equal 50 microamperes and the $V_{EC}$ of Q26 is equal to 0.4 volts, as per Table 1, above. For this condition, equal currents flow through networks 129 and 131 and the voltage $V_{R5}$ across resistor R5 is equal to $V_{EC26}$, whereby $I_{C19} \times R_5$ is equal to $V_{EC26}$.

The response of the circuit to increasing values of load resistance (i.e. decreasing load currents) may be seen by assuming that the assumed load resistor of 33.3 ohms is increased. As $R_L$ increases, the load current therethrough decreases. As the load current decreases (assuming that $I_{B26}$ does not respond immediately), $V_{EC26}$ decreases. As $V_{EC26}$ decreases, more current flows through network 131 (i.e. $I_{C20}$ increases). Due to the summing of $I_{C19}$ and $I_{C20}$, $I_{C19}$ decreases. The decrease in $I_{C19}$ causes a corresponding decrease in $I_{B26}$, which decrease continues until an equilibrium condition, 'satisfying the equations discussed above, is reached. It is therefore evident that $V_{EC26}$ of Q26 is always at, or below, the maximum specified value of $V_{CE}$ for Q26, while the base current, supplied to Q26, is appropriately controlled and sufficient to drive Q26 to a desirable saturation level without overdriving it.

It may also be shown that as the Beta of Q26 increases, the base drive to Q26 decreases and $V_{EC26}$ also decreases. If and when Beta increases, assuming $I_L$ to be constant and that $I_{B26}$ does not respond immediately, $V_{EC26}$ decreases as Q26 is driven deeper into saturation. As the emitter-to-collector voltage of Q26 decreases, the current $I_{C20}$ increases causing a corresponding decrease in $I_{C19}$. The corresponding decrease in $I_{C19}$ causes a decrease in $I_{B26}$. Thus, in contrast to prior art circuits, when the Beta of the switching transistor Q26 is increased, the circuit of the invention tends to reduce the base drive resulting in a reduction in base drive dissipation while maintaining the collector-to-emitter voltage within a required range.

Other features of the invention may be better appreciated by referring to FIG. 2 in which a current source circuit 123 and a current mirror amplifier 125 suitable for practicing the invention are detailed.

The current source 123 includes a bandgap network 12, and a current mirroring network 14 to produce the current $I_K$.

In the circuit of FIG. 2, $V_{IN}$ applied to input power terminal 11 may, for example, vary over a very wide range (e.g. from 4 volts to more than 16 volts). The bandgap reference circuit 12 is used to produce a relatively fixed bandgap reference voltage ($V_{BG}$) which is used to generate a current ($I_{REF}=V_{BG}/R_3$). A current $I_{C14}=I_K$ proportional to $I_{REF}$ and equal to $I_{C19}$ plus $I_{C20}$ is then made to flow out of node 121.

The bandgap reference circuit 12 includes PNP transistors Q1 and Q2 connected at their emitters to input terminal 11 and at their bases to a node 111 to which is also connected the collector of Q2 and the emitter of a PNP transistor Q4. The collector of Q1 is connected to the emitter of a PNP bipolar transistor Q3. The base and collector of Q3 and the base of Q4 are connected to a node 113 to which is also connected the collector of an NPN transistor Q5.

As is known in the art, the transistor string comprising Q1 and Q3 and the transistor string comprising Q2 and Q4 conduct essentially identical currents (where Q1 is the same size as Q2, and Q3 is the same size as Q4) whereby current $I_{C3}$ out of the collector of Q3 is equal to the current $I_{C4}$ out of the collector of Q4; (i.e., $I_{C3}=I_{C4}$).

The collector of an NPN transistor Q5 is connected to node 113 and its emitter is connected to the collector of an NPN transistor Q6. The base of transistor Q5, the collector of a transistor Q7, and the collector of a transistor Q4 and the base of a transistor Q9 are connected to a node 115. The bases of Q6 and Q7 and the emitter of Q9 are connected to a node 117 at which is produced the bandgap voltage, $V_{BG}$. A reference current level setting resistor $R_3$ is connected between node 117 and ground.

For reasons detailed below, Q6 is made 10 times the physical size of Q7 resulting in Q6 and Q7 having different current densities and different $V_{BE}$'s. Typically, for the configuration of FIG. 2, by making the size of Q6 ten times the size of Q7 and by forcing equal collector-to-emitter currents through the two transistors the $V_{BE}$ of Q7 minus the $V_{BE}$ of Q6 is approximately equal to 60 millivolts at 25° C.

A resistor $R_1$ connected between the emitter of Q6 and a node 119, to which is also connected the emitter of Q7, sets the amplitude of $I_{C3}$ and thereby the amplitude of $I_{C4}$. A resistor $R_2$ connected between node 119 and ground, sets the potential at node 119.

When power is first applied to the bandgap circuit, there may be no conduction via Q1, Q2, Q3 and Q4. Start-up circuit 18 is provided to ensure that bandgap circuit 12 is rendered operative on power up and at any time thereafter. When a voltage $V_{IN}$ is first applied to circuits 12 and 14, transistors Q1, Q2, Q3 and Q4 may be non-conducting. Start up circuit 18 is provided to ensure the initial flow of current out of the bases of Q3 and Q4 causing the turn on of Q1, Q2, Q3 and Q4 and causing $I_{C3}$ and $I_{C4}$ to flow. The flow of the collector current $I_{C4}$ in Q4 turns on Q5 and Q9. The turn-on of Q9 causes the turn-on of Q6 and Q7. With Q5 and Q6 turned-on, the current $I_{C3}$ flows via the collector-to-emitter of Q5 and Q6 and resistor $R_1$ into node 119 and the current $I_{C4}$ flows via the collector-to-emitter of Q7 into node 119. The currents $I_{C3}$ and $I_{C4}$ flowing via $R_2$ to ground cause the potential ($V_{119}$) at node 119 to rises to a value of $[I_{C3}+I_{C4}]\cdot[R_2]$. The rise in potential at node 119 tends to turn-off the start up circuit while the bandgap circuit remains operative.

After the turn-off of the start up circuit 18, the loop in circuit 12 stabilizes and bandgap circuit 12 remains fully operational producing a bandgap voltage ($V_{BG}$) at node 117 which may be calculated from the following two equations:

$$(I_{C3}+I_{C4})(R_2) + V_{BE7} = V_{BG} \qquad \text{eq. 9}$$

The amplitude of $I_{C3}$ may be determined from the following relationship:

$$V_{BE6}+(I_{C3})(R_1)=V_{BE7} \qquad \text{eq. 10}$$

$$I_{C3}=[V_{BE7}-V_{BE6}]/R_1 \qquad \text{eq. 11}$$

For $I_{C3}=I_{C4}$ $$V_{BG}=2[R_2/R_1][V_{BE7}-V_{BE6}]+V_{BE7} \qquad \text{eq. 12}$$

In a particular circuit, by appropriate choice of $R_1$ and $R_2$, $V_{BG}$ was set at 1.26 volts, a value close to the bandgap voltage of silicon which is approximately 1.205 volts.

$V_{BG}$ is used to set a reference current ($I_{R3}$) which flows through resistor $R_3$ and is equal to $V_{BG}/R_3$ and which may be assumed to be relatively constant (e.g. as constant as $V_{BG}$ and $R_3$). The current $I_{R3}$ flowing out of the emitter of Q9 is assumed to be equal to the current $I_{REF}$ in the collector of Q9. The voltage $V_{BG}$ at the emitter of Q9 thus sets the current, $I_{R3}$, which is assumed to be equal to the collector current of Q9, which is identified herein as $I_{REF}$.

The current $I_{REF}$ in the collector of Q9 is identical to the collector current of Q8 and Q10, which current is then mirrored in the collectors of transistors Q11 and Q12. The collector of Q9 is connected to node 130 to which are connected the collector and base of PNP transistor Q8 and the base of PNP transistor Q12. The emitter of Q8 is connected to the collector of PNP transistor Q10. The emitter of Q12 is connected to node 133 to which are connected the collector and base of PNP transistor Q11 and the base of Q10. The emitters of Q10 and Q11 are connected to terminal 11, whereby when Q10 and Q11 have the same physical size, their collector currents are essentially equal. Similarly, the symmetric connection of Q8 and Q12 ensures that where they have the same physical size, their collector currents are essentially equal.

The collector current of Q8 and Q10 is equal to the collector current of Q9 which is equal to $I_{REF}$ (neglecting the base currents). Since the collector and base of Q11 are connected to the base of Q10, and since the base and collector of Q8 are connected to the base of Q12, the current $I_{REF}$ in the collectors of Q8, Q9 and Q10 is "mirrored" in the collectors of transistors Q11 and Q12. The collector current in Q11 and Q12 is proportional to $I_{REF}$ and is then further mirrored to provide current, $I_K$.

The collector of Q12 is connected to node 135 to which are connected the collector and base of NPN transistor Q13 and the base of NPN transistor Q14. The emitter of Q13 is connected to the collector of NPN transistor Q25. The emitter of Q14 is connected to node 137 to which are connected the collector and base of NPN transistor Q28 and the base of Q25. The emitters of Q25 and Q28 are returned to ground potential whereby for Q25 being the same physical size as Q28 and Q13 being the same physical size as Q14, the current flowing in the path defined by the collector-to-emitter of Q13 and Q25 is equal to the current flowing in the path defined by the collector-to-emitters of Q14 and Q28. Furthermore as is known in the art, the cascoding arrangement of: (a) Q13 and Q25, (b) Q14 and Q28, (c) Q11 and Q12, and (d) Q10 and Q8, causes the current mirrors to be more closely matched by reducing errors caused by changes in mirror current with changes in $V_{IN}$.

Consequently, the current flowing through Q11 and Q12, which is essentially equal to $V_{BG}/R_3$, flows into node 135 and through the collector-to-emitter paths of Q13 and Q25 and essentially the same current (i.e. $V_{BG}/R_3$) flows through the collector to emitter paths of Q14 and Q28 and is drawn (or sunk) out of node 121.

Having shown that $I_K$ is equal to $I_{REF}$ or $I_{R3}$ which is equal to $V_{BG}/R_3$, the voltage $V_{R5}$ across $R_5$ may be represented as shown in equation 8.

As already discussed above, the bandgap voltage $V_{BG}$, is constant over temperature; the ratio of $R_5$ to $R_3$ is also constant over temperature assuming the resistors are similarly constructed and $I_{C19}$ is a fraction of $I_K$. Hence, $V_{R5}$ is a function of the portion of $I_K$ which flows through $R_5$ and is virtually independent of temperature. This is also a significant feature of the circuit.

The current mirror amplifier 125 includes an input node 138 to which is connected the collector and base of NPN transistor Q21 and the base of NPN transistor Q22 and the collector of Q18, whereby $I_{C18}$ flows into input node 138. The emitter of Q21 is connected to node 139 to which are connected the emitter of Q22, the collector and base of NPN transistor Q23 and the base of NPN transistor Q24. A resistor R6 is connected between the emitter of Q23 and ground and a resistor R7 is connected between the emitter of Q24 and ground. Q22 is made N times the physical size of Q21; Q24 is made M times the physical size of Q23 and R7 is made to have a value of R6/M. In one design, N was chosen equal to 10 and M was chosen equal to 10. The collectors of Q22 and Q24 are connected in common to CMA 125 output node 141 with the sum of the currents in Q22 and Q24 being equal to $I_{B26}$. In the discussion to follow, as before, base currents are neglected.

The operation of CMA 125 is briefly as follows. The current, $I_{C18}$ into node 138 is equal to $JI_{C19}$. $I_{C18}$ into node 138 causes a current equal to $I_{C18}$ to flow via the collector-to-emitter of Q21 into node 139 and an $I_{C22}$ current of $N \cdot I_{C18}$ to flow via the collector-to-emitter of Q22 into node 139. The current $(N+1)(I_{C18})$ flowing into node 139 is amplified by Q24 to produce an $I_{C24}$ of $M \cdot (N+1) I_{C18}$.

The net current drawn out of node 141 is equal to $I_{C22}+I_{C24}$. Since $I_{C22}$ is equal to $N \cdot I_{C18}$ and since $I_{C24}$ is equal to $M \cdot (N+1)I_{C18}$, the current $I_{B26}$ drawn out of Q26 may be expressed as follows:

$$I_{B26} \approx N\ I_{C18} + M(N+1)I_{C18} \approx I_{C18}\ [MN+M+N]$$

Since $I_{C18} = J\ I_{C19}$ $$I_{B26} = (I_{C19})(J[M(N+1)+N])$$

where J = 3, M = 10 and N = 10

$$I_{B26} = (I_{C19})\ [360].$$

It should be evident that the multiplication factor (i.e., J.Z) of the $I_{C19}$ current to produce $I_{B26}$ may be made larger or smaller depending on the amount of $I_{B26}$ desired or required.

What is claimed is:

1. The combination comprising:
   first and second power terminals for the application therebetween of an input voltage ($V_{IN}$);
   an output terminal;
   means for the connection of a load means between said output terminal and said second power terminal;
   a selectively enabled transistor switch having a collector and an emitter defining the ends of its main conduction path and a base for the application thereto of base drive;
   means connecting the collector-to-emitter path of said transistor switch between said first power terminal and said output terminal; and
   controllable base drive means coupled between the base of said transistor switch and said second power terminal for supplying base drive to said transistor switch and causing an amplified current to flow between its collector and emitter, said controllable base drive means including sensing means coupled to the emitter and collector of said transistor switch for sensing when the voltage between the collector and the emitter is less than a predetermined value as a result of excessive base drive and for then reducing the base current flowing in the base of said transistor switch.

2. The combination as claimed in claim 1 wherein said controllable base drive means including said sensing means includes comparator means for producing; (a) a first current proportional to the voltage at the emitter of said transistor switch; (b) a second current proportional to the voltage at the collector of said transistor switch; and (c) an output current indicative of whether said first current is greater than or less than said second current.

3. The combination comprising:
   first and second power terminals for the application therebetween of an input voltage ($V_{IN}$);
   an output terminal;
   means for the connection of a load means between said output terminal and said second power terminal;
   a selectively enabled transistor switch having a collector and an emitter defining the ends of its main conduction path and a base for the application thereto of base drive;
   means connecting the collector-to-emitter path of said transistor switch between said first power terminal and said output terminal;
   voltage difference sensing means connected between the emitter and collector of said transistor switch for sensing when a difference between a voltage at said emitter and a voltage at said collector of said transistor switch is less than a predetermined value and for producing a control current which decreases as a function of a decrease in said collector-to-emitter voltage below said predetermined value; and
   current amplifying means coupled between said voltage difference sensing means and the base of said transistor switch for amplifying said control current and supplying said amplified current to the base of said transistor switch.

4. The combination as claimed in claim 3 wherein said voltage difference sensing means includes:
   (a) a first means connected between the emitter of said transistor switch and a first node for passing a first current which is a function of the voltage at said emitter;

(b) a second means connected between the collector of said transistor switch and said first node for passing a second current which is a function of the voltage at said collector; and (c) a current source connected between said first node and said second power terminal for summing the current in said first and second means.

5. The combination as claimed in claim 4 wherein said current source produces a relatively constant current which is equal to the sum of said first and second currents, whereby when said first current increases, said second current decreases and when said first current decreases said second current increases.

6. The combination as claimed in claim 4 wherein said current source produces a reference current;

wherein the sum of said first and second currents is equal to said reference current; and wherein when the ratio of said first current to said reference current decreases, the ratio of said second current to said reference current increases and when the ratio of said first current to said reference current increases, the ratio of said second current to said reference current decreases.

7. The combination as claimed in claim 3 wherein said voltage difference sensing means includes:

(a) first means comprising a first resistor and a first transistor with the resistor being connected in series with the collector-to-emitter path of said first transistor between a first node and one of said collector and emitter of said transistor switch; and (b) a second means comprising a second transistor whose collector-to-emitter path is connected between the other one of said collector and emitter of said transistor switch and said first node; and (c) a current source connected between said first node and said second power terminal for passing a reference current therebetween.

8. The combination as claimed in claim 7 wherein the bases of said first and second transistors are coupled to said first node, and wherein the amplitude of the voltage drop across the collector-to-emitter of said transistor switch is equal to the amplitude of the voltage drop across said first resistor when the collector-to-emitter current of said first transistor is equal to the collector-to-emitter current of said second transistor.

9. The combination as claimed in claim 8 wherein said reference current ($I_K$) is equal to $(r)(V_{BG})/R_3$;

and wherein the voltage drop across said first resistor is equal to:

$$r[V_{BG}/R_3][R_1][I1/I_K];$$

where:

r is a constant;

$V_{BG}$ is approximately equal to the bandgap voltage of silicon; and $R_3$ is the ohmic value of a resistor $R_3$;

$R_1$ is the ohmic value of said first resistor; and

I1 is the current through said first resistor.

10. In a circuit in which the collector-to-emitter path of a transistor switch is connected in series with a load between first and second power terminals for the application therebetween of an operating potential and a means is coupled between the base of said transistor switch and said second power terminal for supplying base drive to said transistor switch and causing a corresponding collector-to-emitter current; means for regulating the base drive supplied to said transistor switch as a function of the collector-to-emitter current flowing through said transistor switch, comprising:

voltage difference sensing means connected between the emitter and collector of said transistor switch for sensing a difference between a voltage at the emitter and a voltage at the collector of said transistor switch and for producing a control current which decreases when said collector-to-emitter voltage decreases below a predetermined value; and current amplifying means coupled between said voltage difference sensing means and the base of said transistor switch for amplifying said control current and supplying said amplified current to the base of said transistor switch.

* * * * *

UNITED STATES PATENT AND TRADEMARK OFFICE
CERTIFICATE OF CORRECTION

PATENT NO. : 4,634,878

DATED : Aug. 4, 1987

INVENTOR(S) : Raymond L. Giordano

It is certified that error appears in the above-identified patent and that said Letters Patent is hereby corrected as shown below:

Col. 3, line 63 (eq. 6) after "$I_{C20}$]" insert -- + --.

Col. 4, line 7 (eq. 7) delete "$\approx$" and insert --$\simeq$--.

Col. 9, line 53, delete "$\approx$" (first and second occurrence) and insert --$\equiv$--.

Signed and Sealed this

Seventh Day of June, 1988

Attest:

DONALD J. QUIGG

*Attesting Officer*   *Commissioner of Patents and Trademarks*